(12) United States Patent
Dono et al.

(10) Patent No.: US 8,947,128 B2
(45) Date of Patent: Feb. 3, 2015

(54) SEMICONDUCTOR DEVICE HAVING INPUT RECEIVER CIRCUIT THAT OPERATES IN RESPONSE TO STROBE SIGNAL

(71) Applicant: Elpida Memory, Inc., Chuo-ku, Tokyo (JP)

(72) Inventors: Chiaki Dono, Chuo-ku (JP); Seiji Narui, Chuo-ku (JP); Seiichi Maruno, Kokubunji (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/628,920

(22) Filed: Sep. 27, 2012

(65) Prior Publication Data

US 2013/0082761 A1   Apr. 4, 2013

(30) Foreign Application Priority Data

Sep. 29, 2011   (JP) .................................. 2011-213701

(51) Int. Cl.
*H03B 1/00*   (2006.01)
*H03K 3/00*   (2006.01)

(52) U.S. Cl.
USPC ........................................... 327/108; 327/65

(58) Field of Classification Search
USPC ........................................ 327/108, 63, 65, 77
See application file for complete search history.

(56) References Cited

U.S. PATENT DOCUMENTS

| 6,314,039 | B1* | 11/2001 | Hill et al. ....................... 365/207 |
| 6,753,701 | B2* | 6/2004 | Chang .............................. 326/93 |
| 7,174,279 | B2* | 2/2007 | Conner ........................ 702/189 |
| 7,368,931 | B2* | 5/2008 | Kim ........................... 324/750.3 |
| 8,040,340 | B2* | 10/2011 | Chuang et al. ................. 345/211 |
| 2001/0032136 | A1* | 10/2001 | Jang ................................ 705/14 |
| 2001/0038569 | A1 | 11/2001 | Fujisawa et al. |
| 2011/0069554 | A1 | 3/2011 | Lo Giudice et al. |

FOREIGN PATENT DOCUMENTS

JP   2001-312886 A   9/2001

OTHER PUBLICATIONS

Communication from the European Patent Office issued Jan. 30, 2013 in counterpart European Application No. 12185003.6.

* cited by examiner

*Primary Examiner* — Quan Tra
(74) *Attorney, Agent, or Firm* — Sughrue Mion, PLLC

(57) ABSTRACT

Disclosed herein is a device that includes an input receiver circuit activated by a strobe signal to generate an output signal by comparing a potential of an input signal with a reference potential, and a noise canceller cancelling noise superimposed on the reference potential due to a change in the strobe signal.

13 Claims, 9 Drawing Sheets

SEMICONDUCTOR DEVICE HAVING INPUT RECEIVER CIRCUIT THAT OPERATES IN RESPONSE TO STROBE SIGNAL

BACKGROUND OF THE INVENTION

1. Field of the Invention

The present invention relates to semiconductor devices and, in particular, relates to a semiconductor device having an input receiver circuit to acquire an input signal in synchronization with a strobe signal.

2. Description of Related Art

With a semiconductor device executing high-speed data transfer such as DRAM (Dynamic Random Access Memory), input/output of a data signal may be performed in synchronism with a strobe signal (see Japanese Patent Application Laid-open No. 2001-312886). Meanwhile, an input receiver circuit that receives an input data signal often has the structure to generate an output signal by comparing a potential of the input data signal with a reference potential.

However, a change in the strobe signal may cause noise in the reference potential. When the noise is superimposed on the reference potential, an operating margin of the input receiver circuit decreases, which makes the high-speed data transfer difficult.

Such a difficulty becomes serious especially when the reference potential is generated inside a semiconductor device. Further, such a difficulty becomes more serious especially when the input receiver circuit that is activated by the strobe signal is employed. Furthermore, such a difficulty becomes even more serious especially when the strobe signal is generated by complementary external strobe signals that are supplied from the outside and potential of the external strobe signals is fixed to a high level or a low level during a period when the input data signal is not supplied thereto.

SUMMARY

In one embodiment, there is provided a semiconductor memory device that includes: an input receiver circuit activated by a strobe signal to generate an output signal by comparing a potential of an input signal with a reference potential; and a noise canceller cancelling noise superimposed on the reference potential due to a change in the strobe signal.

In another embodiment, there is provided a semiconductor memory device that includes: a first input circuit including a first transistor having one end connected to a first power supply line and a control electrode supplied with a control signal, and a second transistor having one end connected to the other end of the first transistor and a control electrode supplied with a reference voltage; and a first circuit including a third transistor having one end connected to the first power supply line and a control electrode supplied with an inverted signal of the control signal, and a fourth transistor having one end connected to the other end of the third transistor and a control electrode supplied with the reference voltage.

In still another embodiment, there is provided a semiconductor memory device that includes: an input circuit comparing an input signal supplied via an input signal line with a reference voltage supplied via a reference voltage supply line to output an output signal, an operation timing of the input circuit being controlled by a control signal supplied via a control signal line; and a noise cancellation circuit connected between the control signal line and the reference voltage supply line. Any circuit that cancels noise is not connected between the control signal line and the input signal line.

DETAILED DESCRIPTION OF THE EMBODIMENTS

Preferred embodiments of the present invention will be explained below in detail with reference to the accompanying drawings.

Figure 1:
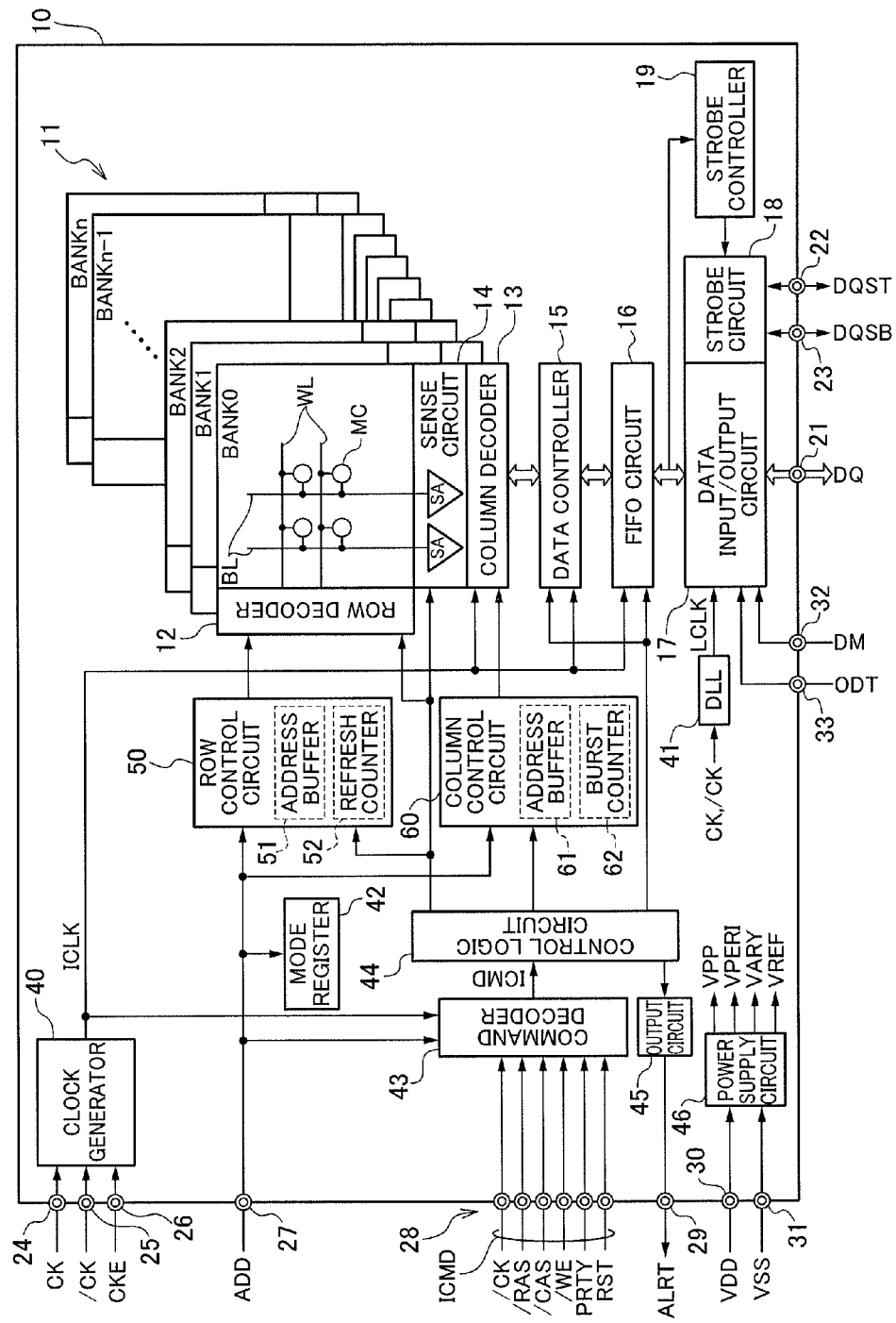
FIG. 1 is a block diagram showing the entire structure of a semiconductor device according to an embodiment of the present invention.

Turning to FIG. 1, the semiconductor device 10 according to this embodiment is DRAM integrated on single semiconductor chip, and includes a memory cell array 11 that is divided into n+1 banks. The bank is a unit capable of executing a command independently, and basically, non-exclusive operation is possible between the banks.

The memory cell array 11 is provided with a plurality of word lines WL and a plurality of bit lines BL that are intersecting each other, and memory cells MC are arranged at points of the intersection. The word line WL is selected by a row decoder 12 and the bit line BL is selected by a column decoder 13. The bit lines BL are respectively connected to corresponding sense amplifiers SA in a sense circuit 14, and the bit line BL that is selected by the column decoder 13 is connected to a data controller 15 via the sense amplifier SA. The data controller 15 is connected to a data input/output circuit 17 via a FIFO circuit 16. The data input/output circuit 17 is a circuit block for inputting/outputting data via a data terminal 21.

The semiconductor device 10 has further external terminals such as strobe terminals 22 and 23, clock terminals 24 and 25, a clock enable terminal 26, an address terminal 27, command terminals 28, an alert terminal 29, power supply terminals 30 and 31, a data mask terminal 32, an ODT terminal 33 and the like.

The strobe terminals 22 and 23 are terminals for inputting/outputting external strobe signals DQST and DQSB, respectively. The external strobe signals DQST and DQSB are complementary to each other, and define input/output timing of the data to be inputted/outputted via the data terminal 21. Specifically, the external strobe signals DQST and DQSB are supplied to a strobe circuit 18 when the data is inputted, that is, during write operation, and based on these signals, the strobe circuit 18 controls operation timing of the data input/output circuit 17. Write data that is inputted via the data terminal 21 is thus received into the data input/output circuit 17 in synchronism with the external strobe signals DQST and DQSB. On the other hand, when the data is outputted, that is, during read operation, a strobe controller 19 controls operation of the strobe circuit 18. Read data is thus outputted from the data input/output circuit 17 in synchronism with the external strobe signals DQST and DQSB.

The clock terminals 24 and 25 are supplied with external clock signals CK and /CK, respectively. The external clock signals CK and /CK are transferred to a clock generator 40. The signal having "/" before the signal name herein means that the signal is a low active signal or an inverted signal of the corresponding signal. Therefore, the external clock signals CK and /CK are complementary to each other. The clock generator 40 is activated based on a clock enable signal CKE that is supplied via the clock enable terminal 26, to generate an internal clock signal ICLK. The external clock signals CK and /CK that are supplied via the clock terminals 24 and 25 are also supplied to a DLL circuit 41. The DLL circuit 41 is a circuit to generate an output clock signal LCLK that is phase-controlled based on the external clock signals CK and /CK. The output clock signal LCLK is used as a timing signal defining output timing of the read data DQ from the data input/output circuit 17.

The address terminal 27 is supplied with an address signal ADD. The address signal ADD supplied to the address terminal 27 is transferred to a row control circuit 50, a column control circuit 60, a mode register 42, a command decoder 43 and the like. The row control circuit 50 includes an address buffer 51, a refresh counter 52 and the like, and controls the row decoder 12 based on the row address. Further, the column control circuit 60 includes an address buffer 61, a burst counter 62 and the like, and controls the column decoder 13 based on the column address. When a mode register set command is issued, the address signal ADD is supplied to the mode register 42 so as to update the contents of the mode register 42.

The command terminals 28 are supplied with a chip select signal /CS, a row address strobe signal /RAS, a column address strobe signal /CAS, a write enable signal /WE, a parity signal PRTY, a reset signal RST and the like. These command signals CMD are transferred to the command decoder 43 and, based on these command signals CMD, the command decoder 43 generates an internal command signal ICMD. The internal command signal ICMD is supplied to a control logic circuit 44. Based on the internal command signal ICMD, the control logic circuit 44 controls operation of the row control circuit 50, the column control circuit 60 and the like.

The command decoder 43 includes a not-shown verification circuit. The verification circuit verifies the address signal ADD and the command signal CMD based on the parity signal PRTY and, if an error is found in the address signal ADD or the command signal CMD as a result of the verification, outputs an alert signal ALRT via the control logic circuit 44 and an output circuit 45. The alert signal ALRT is outputted to the outside via the alert terminal 29.

The power supply terminals 30 and 31 are supplied with power supply potentials VDD and VSS, respectively. The power supply potentials VDD and VSS are supplied to a power supply circuit 46. The power supply circuit 46 is a circuit block to generate various internal potentials based on the power supply potentials VDD and VSS. The internal potentials generated by the power supply circuit 46 include a boosting potential VPP, a power supply potential VPERI, an array potential VARY, a reference potential VREF and the like. The boosting potential VPP is generated by boosting the power supply potential VDD, and the power supply potential VPERI, the array potential VARY and the reference potential VREF are generated by stepping down the power supply potential VDD.

The boosting potential VPP is mainly used in the row decoder 12. The row decoder 12 drives the word line WL, selected based on the address signal ADD, to the VPP level, to thereby allow a cell transistor included in the memory cell MC to conduct. The array potential VARY is mainly used in the sense circuit 14. When the sense circuit 14 is activated, one of a bit line pair is driven to the VARY level and the other is driven to the VSS level, so as to amplify the read data that is read out from the selected memory cell MC. The power supply potential VPERI is used to most peripheral circuits including the row control circuit 50, the column control circuit 60 and the like. As the power supply potential VPERI, whose voltage is lower than that of the power supply potential VDD, is used to these peripheral circuits, it is possible to reduce power consumption of the semiconductor device 10. Further, the reference potential VREF is a potential used in the data input/output circuit 17. It will be described in detail later how the reference potential VREF is used in the data input/output circuit 17.

The data mask terminal 32 and the ODT terminal 33 are supplied with a data mask signal DM and a termination signal ODT, respectively. The data mask signal DM and the termination signal ODT are supplied to the data input/output circuit 17. The data mask signal DM is activated when masking apart of the write data and the read data, and the termination signal ODT is activated when using an output buffer included in the data input/output circuit 17 as a termination resistor.

The entire structure of the semiconductor device 10 according to this embodiment has been described thus far. Focusing on the data input/output circuit 17 and the strobe circuit 18, the semiconductor device 10 of this embodiment will be explained in more detail as below.

Figure 2:
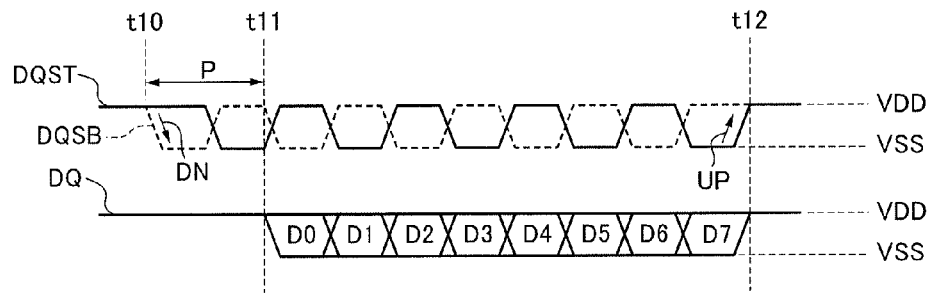
FIG. 2 is a timing chart showing waveforms of a write data and external strobe signals during a write operation.

Turning to FIG. 2, a burst length is eight bits and the write data DQ is inputted serially during a period from a time t11 to a time t12. Here, the burst length means the number of bits of the data DQ inputted (or outputted) serially based on one column access. This basically corresponds to the number of the so-called pre-fetches, and is eight bits in DDR4 (Double Data Rate 4) SDRAM (Synchronous DRAM).

As shown in FIG. 2, the level of the data terminal 21 to input the write data DQ is fixed to the VDD level before the time t11. Similarly, the levels of the strobe terminals 22 and 23 to be input the external strobe signals DQST and DQSB are also fixed to the VDD level. Clocking of the external strobe signals DQST and DQSB is started from a time t10 that is earlier than the time t11 when burst input is started. The clocking of the external strobe signals DQST and DQSB means the state in which the external strobe signals DQST and DQSB become signals complementary to each other, one being the VDD level and the other being the VSS level, and the signal levels are inverted for every ½ clock cycle. A period P from the time t10 to the time t11 corresponds to a preamble period before executing the burst input of the write data DQ.

At the time t11, the write data DQ is subjected to the burst input in synchronism with the clocking of the external strobe signals DQST and DQSB. In FIG. 2, eight bits consisting of D0 to D7 are subjected to the burst input in this order. When the burst input is completed at the time t12, the levels of the terminals 21 to 23 return to the VDD level.

In the operation shown in FIG. 2, the external strobe signals DQST and DQSB are likely to become noise sources at the time t10 and the time t12. The time t10 is when the external strobe signals DQST and DQSB, both of which were at the VDD level, change to the levels that are complementary to each other. The external strobe signal DQST on one hand does not change from the VDD level, whereas the external strobe signal DQSB on the other hand changes from the VDD level to the VSS level as shown by an arrow DN. The time t12 is when both of the external strobe signals DQST and DQSB, which were at the levels complementary to each other, become the VDD level. The external strobe signal DQSB on one hand does not change from the VDD level, whereas the external strobe signal DQST on the other hand changes from the VSS level to the VDD level as shown by an arrow UP. The change in the level of only one of the signals like this causes the noise source. As will be described later, level variations in the reference potential VREF due to such a noise source can be decreased according to this embodiment.

Figure 3:
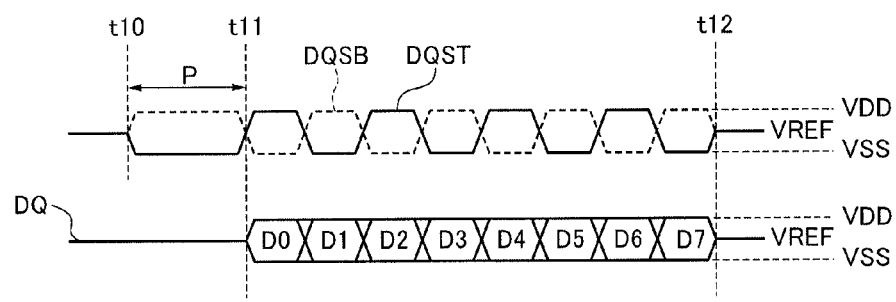
FIG. 3 is a timing chart showing waveforms that the inventors have conceived as a prototype in the course of making the present invention.

Turning to FIG. 3, that shows waveforms of the prototype, the level of the data terminal 21 is fixed to the VREF level before the time t11. The VREF level is an intermediate level between the VDD level and the VSS level, which can be defined as follows:

$$VREF=(VDD+VSS)/2$$

Similarly, the external strobe signals DQST and DQSB are also fixed to the VREF level before the time t10. The clocking of the external strobe signals DQST and DQSB is performed during the period from the time t10 to the time t12.

Thus, when the termination level is set to be the VREF level, the noise is hardly generated because symmetry between the external strobe signals DQST and DQSB is maintained at a start and an end of the clocking. It should be noted that the present invention is applicable to the case where the external strobe signals DQST and DQSB are terminated at the VREF level as shown in FIG. 3.

Detailed circuit configuration of the data input/output circuit 17 and the strobe circuit 18 will be explained next.

Figure 4:
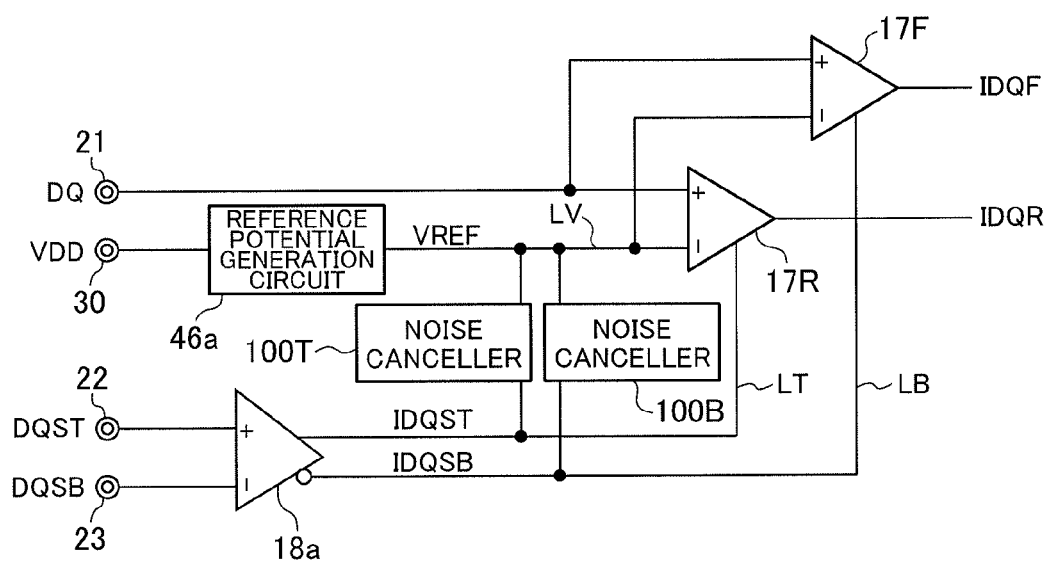
FIG. 4 is a circuit diagram showing the structure of an essential part of the data input/output circuit and the strobe circuit shown in FIG. 1.

Referring now to FIG. 4, the data input/output circuit 17 includes two input receiver circuits 17R and 17F. Each of the input receiver circuits 17R and 17F includes a positive input node (+) and a negative input node (−), and generates output signals IDQR and IDQF, respectively, based on its potential difference. The output signals IDQR and IDQF are supplied to the FIFO circuit 16 shown in FIG. 1.

The write data DQ is supplied to the positive input nodes of the input receiver circuits 17R and 17F via the data terminal 21, and the reference potential VREF is supplied to the negative input nodes thereof. The reference potential VREF is generated by a reference potential generation circuit 46a included in the power supply circuit 46. In other words, the reference potential VREF is not an outer potential supplied from the outside of the semiconductor device 10, but an internal potential generated inside the semiconductor device 10. Therefore, output impedance of the reference potential generation circuit 46a is higher than that of a driver (controller side) driving DQ, and the reference potential VREF is susceptible to the noise. It should be noted that the outer potential can be used as the reference potential VREF according to the present invention.

The input receiver circuits 17R and 17F are activated based on strobe signals IDQST and IDQSB, respectively. The strobe signals IDQST and IDQSB are internal signals generated by a strobe receiver circuit 18a included in the strobe circuit 18. The strobe receiver circuit 18a compares the levels of the external strobe signals DQST and DQSB and, when the potential of the external strobe signal DQST is higher than the potential of the external strobe signal DQSB, drives the strobe signal IDQST to be the VDD level and the strobe signal IDQSB to be the VSS level. On the other hand, when the potential of the external strobe signal DQST is lower than the potential of the external strobe signal DQSB, it drives the strobe signal IDQST to be the VSS level, and the strobe signal IDQSB to be the VDD level.

Figure 5:
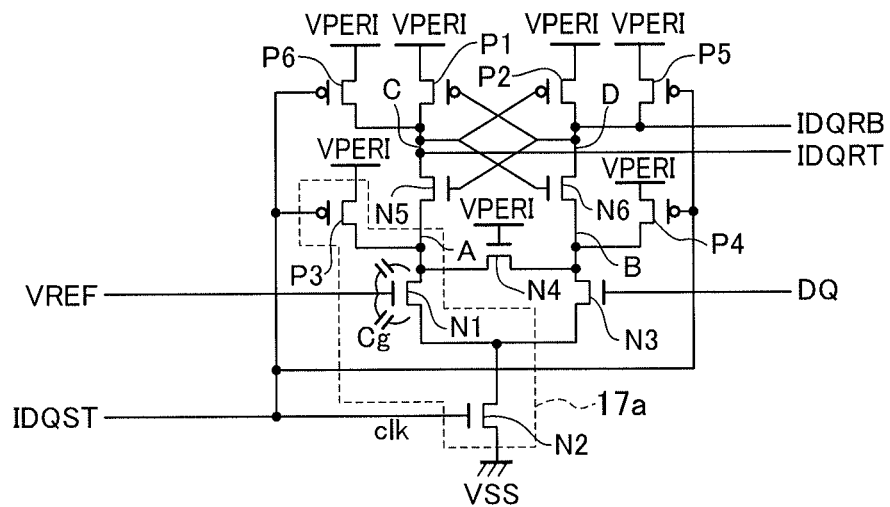
FIG. 5 is a circuit diagram of the input receiver circuit shown in FIG. 4.

Turning to FIG. 5, the input receiver circuit 17R is an amplifier circuit having a latch function, and includes an n-channel MOS transistor N1 to which the reference potential VREF is supplied at its gate electrode, and an n-channel MOS transistor N3 to which the write data DQ is supplied at its gate electrode. Sources of the transistors N1 and N3 are commonly connected to a drain of an n-channel MOS transistor N2. A source of the transistor N2 is connected to the ground potential VSS, and its gate electrode is supplied with the strobe signal IDQST. A drain of the transistor N1 and a drain of the transistor N3 are connected via an n-channel MOS transistor N4. The power supply potential VPERI is supplied to a gate electrode of the transistor N4.

P-channel MOS transistors P1 and P2 and n-channel MOS transistors N5 and N6 that constitute a flip-flop circuit are connected between nodes A and B as the drains of the transistors N1 and N3 and the power supply potential VPERI. An output signal IDQRT is outputted from an output node C of the flip-flop circuit, and an output signal IDQRB is outputted from an output node D. When the strobe signal IDQST becomes the low level, the nodes A to D of the flip-flop circuit are reset to the VPERI level by the p-channel MOS transistors P3 to P6.

According to the structure as described above, the input receiver circuit 17R compares the levels of the write data DQ and the reference potential VREF when the strobe signal IDQST is in the high level. In the case where the level of the write data DQ is higher than that of the reference potential VREF, the input receiver circuit 17R makes the level of the output signal IDQRT high, and the level of the output signal IDQRB low. On the contrary, in the case where the level of the write data DQ is lower than that of the reference potential VREF, the input receiver circuit 17R makes the level of the output signal IDQRT low, and the level of the output signal IDQRB high.

It should be noted that the input receiver circuit 17F has the same circuit structure as that shown in FIG. 5, except that the strobe signal IDQSB is used instead of the strobe signal IDQST.

Figure 10:
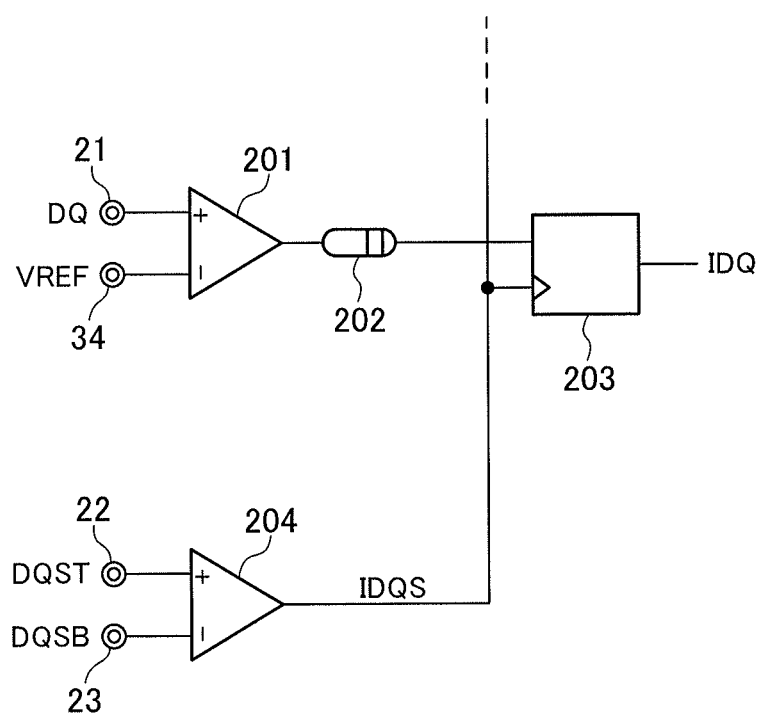
FIG. 10 is a diagram showing a circuit structure by which the change in the strobe signal hardly causes the noise source.

Thus, the input receiver circuits 17R and 17F are the amplifier circuits having the latch function, and therefore high-speed receiver operation is possible as compared with the common input receiver circuit that includes an amplifier circuit not having a latch function and a latch circuit connected at its subsequent stage. This is because a delay circuit for compensation 202, as shown in FIG. 10, is not necessary. At the same time, as the strobe signal IDQST or IDQSB is used at an input initial stage, an operating margin of the input receiver circuit decreases when the noise is superimposed on the strobe signal IDQST or IDQSB. However, such noise can be removed for the most part by noise cancellers 100T and 100B that will be described next.

Turning back to FIG. 4, the noise cancellers 100T and 100B are respectively connected between lines LT and LB transmitting the strobe signals IDQST and IDQSB and a line LV transmitting the reference potential VREF. The noise canceller 100T is a circuit for cancelling the noise generated in the reference potential VREF due to the change in the strobe signal IDQST. Similarly, the noise canceller 100B is a circuit for cancelling the noise generated in the reference potential VREF due to the change in the strobe signal IDQSB.

Figure 6:
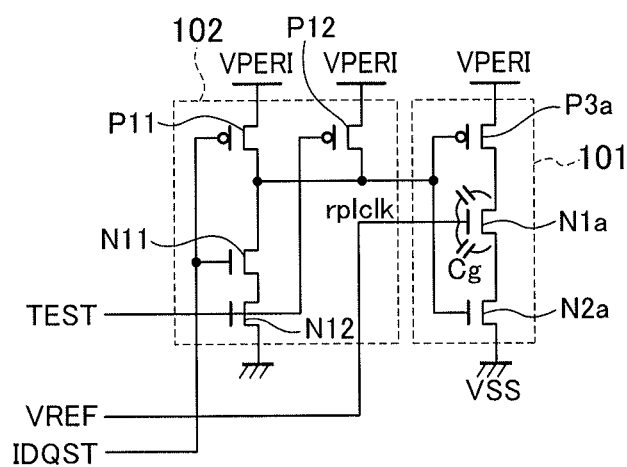
FIG. 6 is a circuit diagram of the noise canceller shown in FIG. 4.

As shown in FIG. 6, the noise canceller 100T includes p-channel MOS transistors P11 and P12 and n-channel MOS transistors N11 and N12 that generate a replica signal rplclk based on the strobe signal IDQST and a test signal TEST. The transistors P11, P12, N11 and N12 constitute a NAND gate circuit 102. The test signal TEST is a signal that changes to the low level during test operation, and is fixed to the high level during normal operation. Accordingly, a waveform of the replica signal rplclk is opposite in phase to that of the strobe signal IDQST during the normal operation. According to the present embodiment, the NAND gate circuit 102 may be referred to as an "opposite-phase signal generation circuit".

The replica signal rplclk is supplied to gate electrodes of a p-channel MOS transistor P3a and an n-channel MOS transistor N2a that are connected in series between the power supply potential VPERI and the ground potential VSS. As shown in FIG. 6, an n-channel MOS transistor N1a is connected between the transistor P3a and the transistor N2a, and the reference potential VREF is supplied to its gate electrode.

The transistors N1a, N2a and P3a are replica transistors of the transistors N1, N2 and P3 included in the input receiver circuit 17R or 17F, respectively. It is therefore preferable that the transistors N1a, N2a and P3a are designed to have the characteristics substantially matching with those of the transistors N1, N2 and P3. Although it is not necessary to perfectly match the characteristics of the transistors N1a, N2a and P3a with those of the transistors N1, N2 and P3, it is preferable to match gate capacitance Cg of the transistor N1 with gate capacitance Cg of the transistor N1a as closely as possible.

It should be noted that the circuit structure of the noise canceller 100B is the same as that shown in FIG. 6, except that the strobe signal IDQSB is used instead of the strobe signal IDQST.

Figure 7:
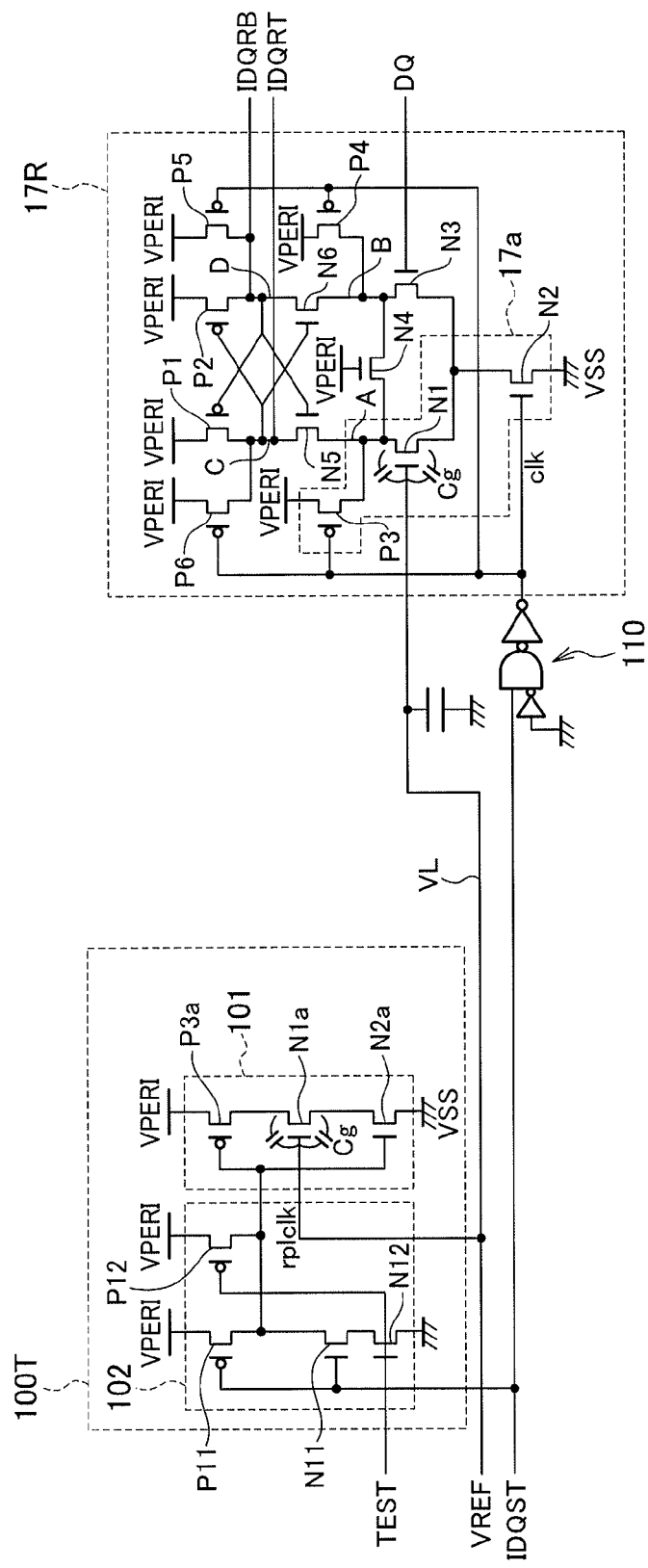
FIG. 7 is a circuit diagram showing a connection between the input receiver circuit and the noise canceller shown in FIG. 4.

Turning to FIG. 7, the strobe signal IDQST is inputted via an AND gate circuit 110 into the transistors N2 and P3 included in the input receiver circuit 17R. Accordingly, when the strobe signal IDQST changes from the low level to the high level, high level noise is superimposed on the reference potential VREF via the gate capacitance Cg included in the transistor N1. On the contrary, when the strobe signal IDQST changes from the high level to the low level, low level noise is superimposed on the reference potential VREF via the gate capacitance Cg included in the transistor N1. As the strobe signals IDQST and IDQSB are basically complementary to each other, the generated noise is cancelled. However, as explained with FIG. 2, only the strobe signal IDQST changes at the time t12, and the noise generated by this is not cancelled.

According to this embodiment, however, the replica signal rplclk, as the inverted strobe signal IDQST, is supplied to a replica circuit 101, which generates the intended noise opposite to the noise generated in the input receiver circuit 17R. The replica circuit 101 is a replica of a circuit part 17a included in the input receiver circuit 17R. As a result, both of the high level noise and the low level noise are given to the line LV transmitting the reference potential VREF, so that variations in the reference potential VREF are hardly caused.

The AND gate circuit 110 is provided to give the delay that is equal to the delay by the NAND gate circuit 102 included in the noise canceller 100T to the strobe signal IDQST. Therefore, when the strobe signal IDQST passing through the AND gate circuit 110 is referred to as a signal clk, change timing of the signal clk and change timing of the replica signal rplclk substantially are coincident with to each other. In the present embodiment, the AND gate circuit 110 may be referred to as a "timing adjustment circuit".

Figure 8:
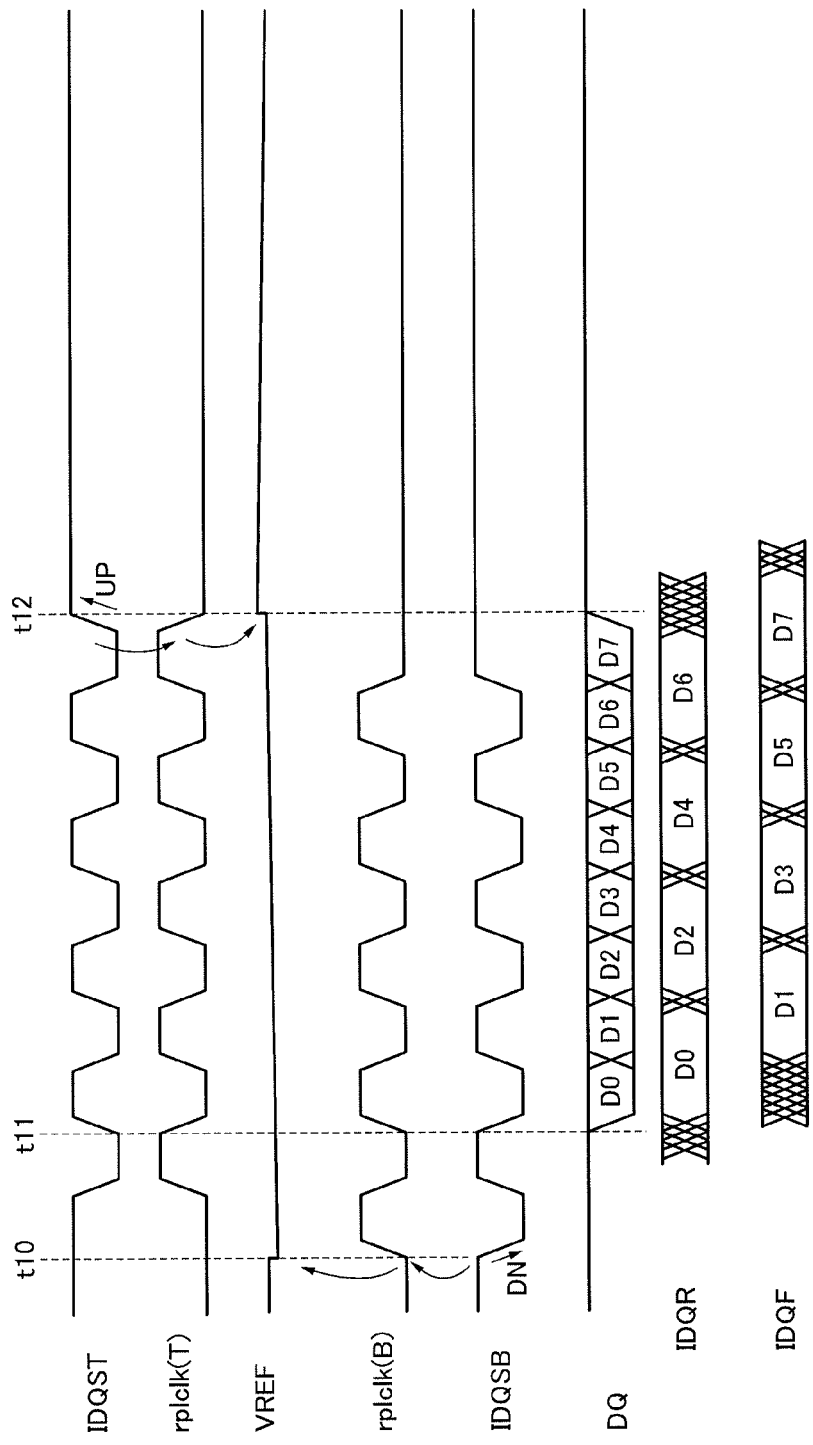
FIG. 8 is a timing chart explaining the effect of the embodiment of the present invention.

FIG. 8 is a timing chart explaining the effect of this embodiment. The times t10 to t12 shown in FIG. 8 correspond to the times shown in FIG. 2.

At the time t10, as shown in FIG. 8, the level of the strobe signal IDQST does not change, and the strobe signal IDQSB changes from the high level to the low level as shown by an arrow DN. Therefore, the low level noise is given to the line LV transmitting the reference potential VREF. According to this embodiment, however, the high level noise is given to the line LV by the noise canceller 100B, so that the variations in the reference potential VREF are extremely small.

Similarly, at the time 12, the level of the strobe signal IDQSB does not change, and the strobe signal IDQST changes from the low level to the high level as shown by an arrow UP. Therefore, the high level noise is given to the line LV transmitting the reference potential VREF. According to this embodiment, however, the low level noise is given to the line LV by the noise canceller 100T, so that the variations in the reference potential VREF are also extremely small.

The write data D0 to D7 inputted serially during a period from the time t11 to the time t12 are alternately received by the input receiver circuits 17R and 17F, and supplied as the output signals IDQR and IDQF into the FIFO circuit 16 shown in FIG. 1. As the reference potential VREF is stable according to this embodiment, the operating margins of the input receiver circuits are sufficiently ensured. Accordingly, window widths of the output signals IDQR and IDQF increase as shown in FIG. 8.

Figure 9:
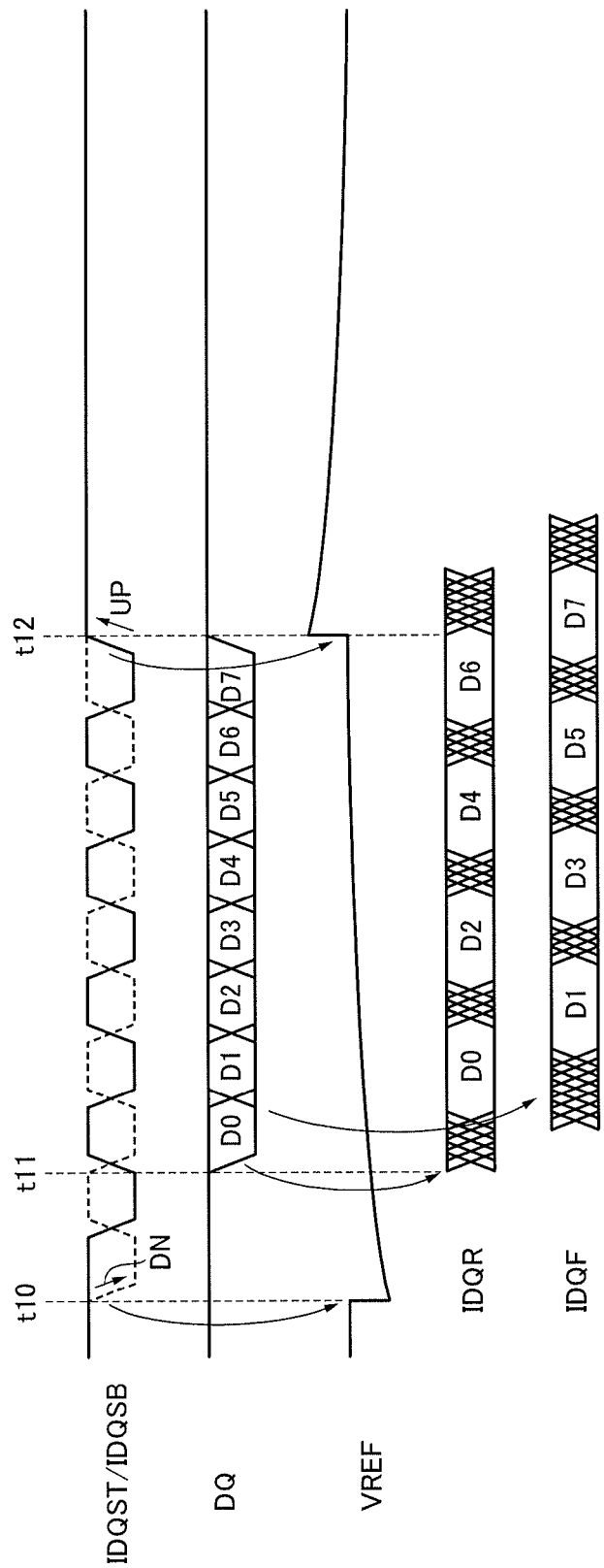
FIG. 9 is a timing chart in the case where the noise cancellers of the embodiment are omitted.

Turning to FIG. 9, when the noise cancellers 100T and 100B are omitted, the reference potential VREF lowers by the change of the strobe signal IDQSB (arrow DN) at the time t10. The lowered reference potential VREF gradually recovers after that. However, as the reference potential VREF is generated inside the semiconductor device 10 according to this example, supply capacity of the reference potential VREF is not so large, which causes slow recovery of the reference potential VREF. This means that the write data are inputted after the time t11 while the level of the reference potential VREF is slightly deviated from its original level. As a result of this, the operating margins of the input receiver circuits decrease, and the window widths of the output signals IDQR and IDQF decrease as shown in FIG. 9. After that, the reference potential VREF rises by the change of the strobe signal IDQST (arrow UP) at the time t12.

According to this embodiment, on the contrary, the noise superimposed on the reference potential VREF is substantially cancelled by the noise cancellers 100T and 100B, which makes it possible to prevent the problem shown in FIG. 9.

Thus, according to this embodiment, it is possible to substantially reduce the noise in the reference potential VREF that is generated when only one of the external strobe signals DQST and DQSB changes. Especially when the reference potential VREF is generated inside the semiconductor device 10 like this embodiment, the level variations of the reference potential VREF are easily caused as compared with a reference potential VREF supplied from the outside, because driving capacity of the reference potential generation circuit 46a is limited. Even in this situation, the level variations of the reference potential VREF can be prevented efficiently according to this embodiment. Accordingly, it is also possible to reduce the capacity of the reference potential generation circuit 46a.

The example in FIG. 10 shows the structure in which a latch circuit 203 is connected at a subsequent stage of an input receiver circuit 201. The input receiver circuit 201 is a circuit that compares the level of the write data DQ supplied via the data terminal 21 with the reference potential VREF supplied via a reference potential terminal 34 so as to generate internal data IDQ based on the result of the comparison. The input receiver circuit 201 is an input initial stage circuit of the so-called current mirror type, and functions as the amplifier circuit not having the latch function. The internal data IDQ is supplied to the latch circuit 203 via the delay circuit for compensation 202.

The latch circuit 203 is a circuit to latch the internal data IDQ in synchronization with a strobe signal IDQS. The strobe signal IDQS is generated by a strobe receiver circuit 204 based on the external strobe signals DQST and DQSB.

When such a circuit structure is adopted, the change in the strobe signal IDQS hardly affects the operating margin of the input receiver circuit 201 because the strobe signal IDQS is not supplied to the input receiver circuit 201. Moreover, according to the example shown in FIG. 10, the reference potential VREF is supplied from the outside via the reference potential terminal 34, so that its potential becomes more stable.

Thus, according to the circuit structure shown in FIG. 10, the change in the strobe signal IDQS hardly affects the operating margin of the input receiver circuit 201. Consequently, it is less necessary for such a circuit structure to provide the noise canceller as in the above-described embodiment. However, it is also possible to provide the noise canceller in the circuit structure shown in FIG. 10, similarly to the above-described embodiment.

A modification of the above embodiment will be explained with reference to FIG. 11.

Figure 11:
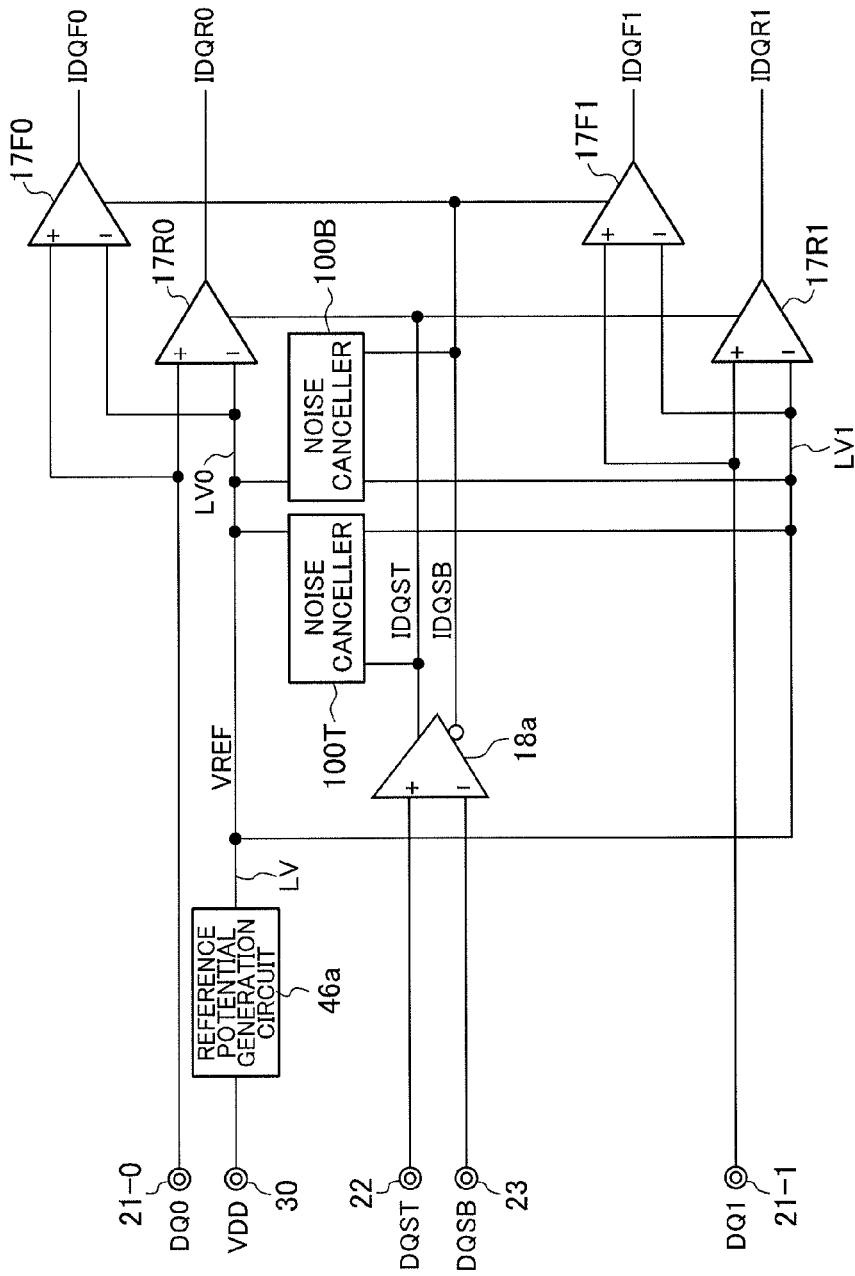
FIG. 11 is a circuit diagram showing the structure of an essential part of the data input/output circuit and the strobe circuit according to a modification.

The example shown in FIG. 11 includes two data terminals 21-0 and 21-1, and the noise cancellers 100T and 100B commonly allocated to input receiver circuits 17R0, 17F0, 17R1 and 17F1 that are connected to the data terminals 21-0 and 21-1. Specifically, the input receiver circuits 17R0 and 17F0 are connected to the data terminal 21-0 through which write data DQ0 is inputted, and the input receiver circuits 17R1 and 17F1 are connected to the data terminal 21-1 through which write data DQ1 is inputted. The reference potential VREF is commonly supplied via the line LV to negative input nodes (−) of the input receiver circuits 17R0, 17F0, 17R1 and 17F1.

However, the input receiver circuits 17R0 and 17F0 are laid out with a certain distance from the input receiver circuits 17R1 and 17F1, and the line LV supplying the reference potential VREF increases in length to some extent. In this case, as shown in FIG. 11, outputs of the noise cancellers 100T and 100B may be connected to a line LV0 near the input receiver circuits 17R0 and 17F0, and the outputs of the noise canceller 100T and 100B may be connected to a line LV1 near the input receiver circuits 17R1 and 17F1. Thus, it is not necessary to provide a pair of the noise cancellers 100T and 100B for every data terminal, and an increase in circuit scale can be suppressed. Further, as the outputs of the noise cancellers 100T and 100B are supplied to the proximity of the negative input nodes (−) of the input receiver circuits, precise noise cancellation is possible without influences of parasitic resistance, parasitic capacitance and the like, even when the line LV is long.

It is also possible to provide a pair of the noise cancellers 100T and 100B for every data terminal, contrary to the example shown in FIG. 11. Thereby, the noise cancellation with higher precision is possible.

It is apparent that the present invention is not limited to the above embodiments, but may be modified and changed without departing from the scope and spirit of the invention.

For example, according to above embodiment, the write data DQ are alternately acquired by alternately activating the input receiver circuits 17R and 17F using the strobe signals IDQST and IDQSB that are complementary to each other, which is not essential to the present invention. Moreover, according to the above embodiment, a pair of the noise cancellers 100T and 100B is connected to the line LV, but only one of the noise cancellers 100T and 100B may be used when only one of the high level noise and the low level noise is of a problem.

Furthermore, when a plurality of input receiver circuits are provided, the noise canceller may be allocated to each of the plurality of input receiver circuits, or one noise canceller may be allocated commonly to the plurality of input receiver circuits.

What is claimed is:

1. A semiconductor device comprising:
an input receiver circuit activated by a strobe signal to generate an output signal by comparing a potential of an input signal with a reference potential; and
a noise canceller cancelling noise superimposed on the reference potential due to a change in the strobe signal, wherein the noise canceller comprises:
an opposite-phase signal generation circuit generating an opposite-phase signal of the strobe signal;
a first replica transistor controlled by the reference potential; and
a second replica transistor connected to the first replica transistor and controlled by the opposite-phase signal.

2. The semiconductor device as claimed in claim 1, wherein
the input receiver circuit comprises:
a first transistor controlled by the reference potential; and
a second transistor connected to the first transistor and controlled by the strobe signal.

3. The semiconductor device as claimed in claim 2, wherein the first transistor and the first replica transistor have substantially the same characteristics as each other.

4. The semiconductor device as claimed in claim 2, further comprising a timing adjustment circuit to substantially match a timing when the strobe signal is supplied to the second transistor with a timing when the opposite-phase signal is supplied to the second replica transistor.

5. The semiconductor device as claimed in claim 2, wherein the input receiver circuit further comprises a third transistor controlled by the input signal, the first and third transistors are commonly connected to the second transistor.

6. The semiconductor device as claimed in claim 1, further comprising a reference potential generation circuit generating the reference potential based on a power supply potential supplied from outside.

7. The semiconductor device as claimed in claim 1, further comprising a strobe receiver circuit generating the strobe signal by comparing potentials of first and second external strobe signals supplied from outside.

8. The semiconductor device as claimed in claim 7, wherein
the first and the second external strobe signals have amplitude between a first potential and a second potential,
potentials of the first and second external strobe signals are complementary to each other during a period when the input signal is supplied, and potentials of the first and second external strobe signals are fixed to either one of the first and second potentials during at least a part of a period when the input signal is not supplied.

9. The semiconductor device as claimed in claim 1, wherein a plurality of the input receiver circuits are provided, the noise canceller being allocated to each of the plurality of the input receiver circuits.

10. The semiconductor device as claimed in claim 1, wherein a plurality of the input receiver circuits are provided, the one noise canceller being commonly allocated to the plurality of the input receiver circuits.

11. A semiconductor device comprising:
an input circuit comparing an input signal supplied via an input signal line with a reference voltage supplied via a reference voltage supply line to output an output signal, an operation timing of the input circuit being controlled by a control signal supplied via a control signal line; and
a noise cancellation circuit connected between the control signal line and the reference voltage supply line,
wherein the noise cancellation circuit comprises an opposite-phase signal generation circuit generating an opposite-phase signal of the control signal, a first replica transistor controlled by the reference potential, and a second replica transistor connected to the first replica transistor and controlled by the opposite-phase signal, and
wherein any circuit that cancels noise is not connected between the control signal line and the input signal line.

12. The semiconductor device as claimed in claim 11, wherein the noise cancellation circuit reduces noise superimposed on the reference voltage due to a transition of the control signal.

13. The semiconductor device as claimed in claim 11, further comprising:
an external signal terminal connected to the input signal line;
an external power supply terminal supplied with a predetermined voltage from outside; and
a reference potential generation circuit connected between the reference voltage supply line and the external power supply terminal to generate the reference voltage based on the predetermined voltage.

* * * * *